(12) United States Patent
Shao et al.

(10) Patent No.: US 10,966,354 B1
(45) Date of Patent: Mar. 30, 2021

(54) LIQUID COOLING MODULE

(71) Applicant: Baidu USA LLC, Sunnyvale, CA (US)

(72) Inventors: Shuai Shao, Milpitas, CA (US); Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/827,174

(22) Filed: Mar. 23, 2020

(51) Int. Cl.
*H05K 7/20* (2006.01)
*H01L 23/473* (2006.01)
*F28D 15/00* (2006.01)

(52) U.S. Cl.
CPC .......... *H05K 7/2079* (2013.01); *F28D 15/00* (2013.01); *H01L 23/473* (2013.01); *H05K 7/20254* (2013.01); *H05K 7/20272* (2013.01)

(58) Field of Classification Search
CPC .......... H05K 7/20254; H05K 7/20509; H05K 7/20636; H05K 7/20772
See application file for complete search history.

(56) References Cited

U.S. PATENT DOCUMENTS

| | | | | |
|---|---|---|---|---|
| 6,111,749 A | * | 8/2000 | Lamb | H01L 23/473 361/699 |
| 7,515,418 B2 | * | 4/2009 | Straznicky | H01L 23/4338 361/699 |
| 10,014,239 B2 | * | 7/2018 | Takemura | H05K 7/20509 |
| 2005/0128705 A1 | * | 6/2005 | Chu | H01L 23/473 361/699 |
| 2019/0335618 A1 | * | 10/2019 | Lunsman | H05K 7/20254 |

* cited by examiner

*Primary Examiner* — Robert J Hoffberg
(74) *Attorney, Agent, or Firm* — Womble Bond Dickinson (US) LLP

(57) ABSTRACT

According to one embodiment, a liquid cooling module includes a chassis, a supply liquid manifold and a return liquid manifold that are both fluidly coupled to a coolant source, a piece of information technology (IT) equipment that is mounted to the chassis and has an IT component, and a frame structure that includes: a pair of primary beams that are coupled to the chassis, a pair of secondary beams, each secondary beam being coupled to both primary beams, and a cold plate that is coupled to the pair of secondary beams. The plate is arranged to come into direct contact with the component. The plate is fluidly coupled to the supply liquid manifold to receive liquid coolant from the source and is fluidly coupled to the return liquid manifold to return warmed coolant to the source that is produced when heat generated by the component is transferred into the coolant.

20 Claims, 12 Drawing Sheets

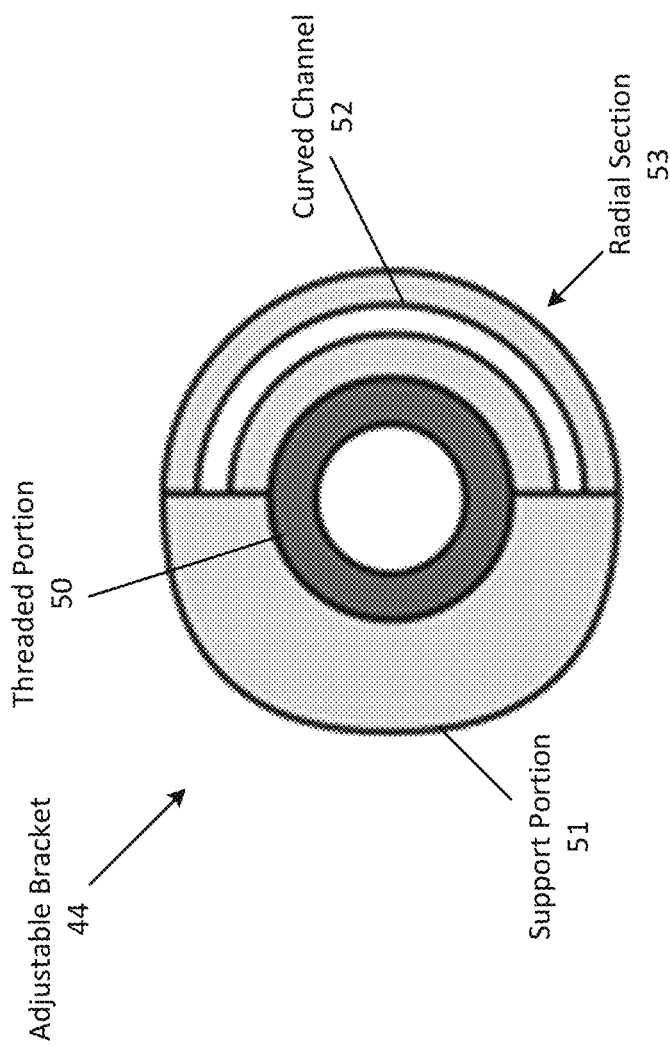

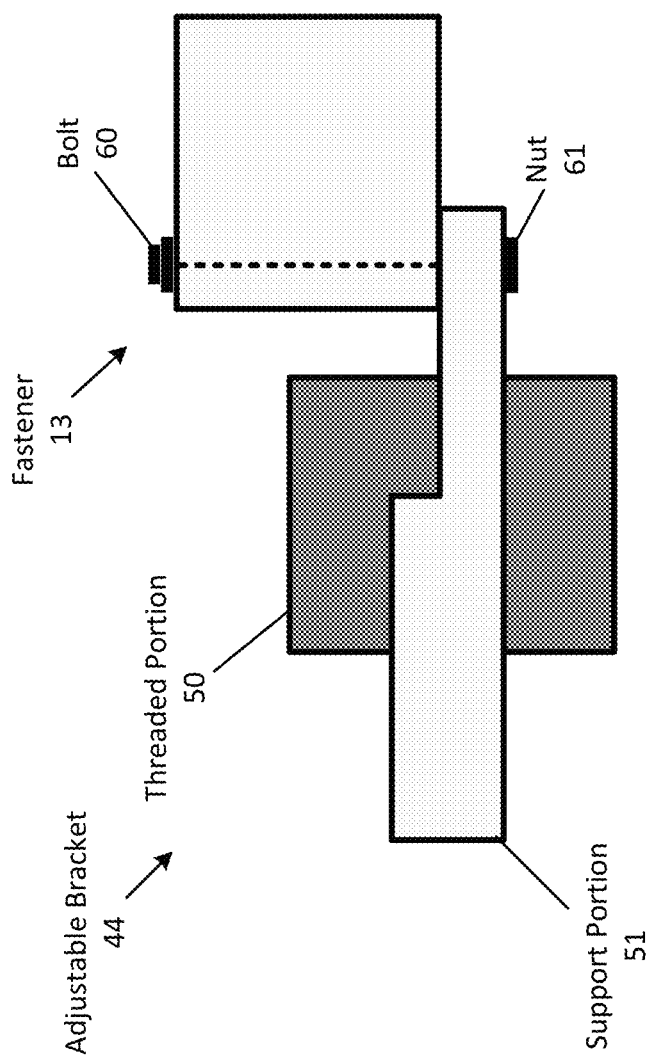

LIQUID COOLING MODULE

FIELD

Embodiments of the present disclosure relate generally to a liquid cooling module.

BACKGROUND

Thermal management for a data center that includes several active electronic racks is critical to ensure proper performance of servers and other IT equipment (e.g., performing IT data processing services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is the use cooling air to cool the IT equipment. The cooling air is recirculated using cooling units that extract heat captured by the cooling air. One commonly used cooling unit is a computer room air conditioning (CRAC) unit that is a device that intakes hot exhaust air and supplies cooling air into the data center to maintain the data center's thermal environment.

Recently, data centers have been deploying more high-power density electronic racks, where more high-density chips are packaged closer together on a server printed circuit board (PCB) to provide more processing power. In addition, a server PCB may include electronics that are mounted on both sides, which may be required for very compute-intense applications. This is especially the case due to developments in artificial intelligence (AI) and cloud-based services, which require high performance and high power density processors, such as control processing units (CPUs) and graphic processing units (GPUs). Cooling these high-density racks by maintaining a proper thermal environment may be an issue with existing cooling systems, such as a CRAC unit. For instance, although the CRAC unit may maintain the thermal environment with more conventional (or lower-density) racks, the unit may be unable to effectively cool high-power density racks because they may generate heat load at a higher rate due to the higher density electronics. In some cases, liquid cooling becomes a more efficient and feasible cooling solution in high power density or high heat flux scenarios.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

FIG. 5 shows a top-down view of an adjustable bracket of the liquid cooling module according to one embodiment.

FIG. 6 shows another view of the adjustable bracket coupled to a primary beam of the liquid cooling module according to one embodiment.

DETAILED DESCRIPTION

Figure 1:
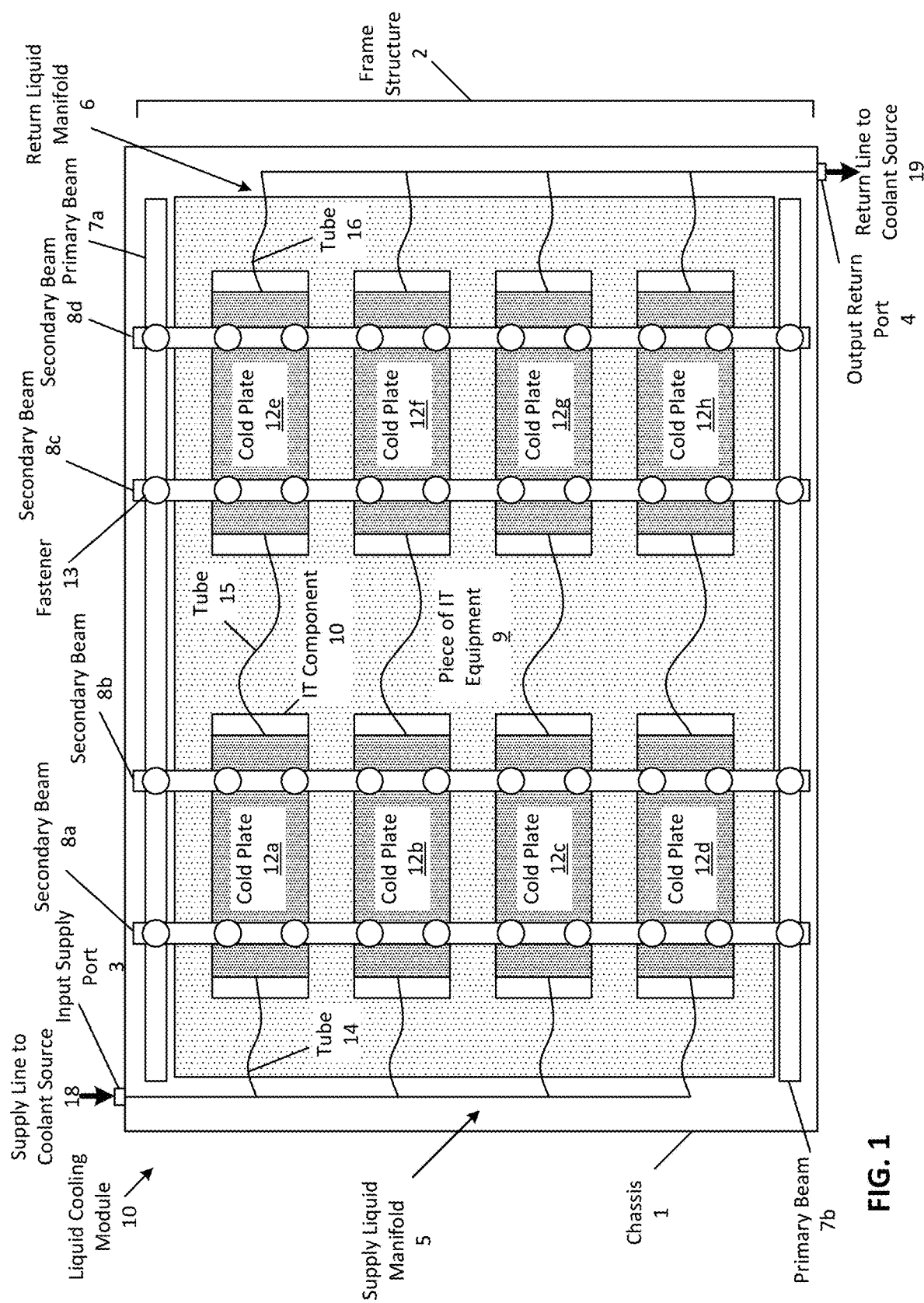
FIG. 1 shows a top-down view of a liquid cooling module for Information Technology (IT) equipment according to one embodiment.

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

The present disclosure solves the problem of liquid cooling high-density servers in a data center. Specifically, the present disclosure describes a liquid cooling module that liquid cools information technology (IT) components (e.g., processors, such as artificial intelligence (AI) acceleration cards that are designed for AI applications) mounted on pieces of IT equipment (e.g., a server printed circuit board (PCB)) using one or more cold plates. For instance, the module may include a frame structure with cold plates that is arranged to be lowered atop the IT equipment in order to put the cold plates in direct contact with the IT components, which when in contact transmits generated heat to the cold plates. In addition, when IT components are mounted on top and on bottom of the piece of equipment, the module may include (at least) two frame structures: one that is disposed on top of the equipment, with cold plates that are arranged to come into contact with the top components in order to extract heat away from the top components, and the other frame structure may be disposed beneath the equipment, with cold plates that are arranged to come into contact with the bottom components in order to extract heat away from these components.

In addition, the liquid cooling module of the present disclosure may be configurable for the needs of the data center. For instance, IT equipment may differ in layout and mounting requirements, for example between different manufacturers. In particular, different pieces of IT equipment may have different layouts of mounted IT components. As an example, one piece may have two rows of four IT components, while another may only have one row of four components. The liquid cooling module described herein solves this problem by having a configurable (or adjustable) frame structure. The frame structure includes movable components that may be adjusted in order to position cold plates of the frame structure such that when the structure is lowed on top of (or positioned beneath) the piece of IT equipment, the cold plates are in direct contact with the equipment's IT components. In addition, the frame structure may include adjustable brackets that may be used to adjust the mounting pressure between the cold plates and IT components in order to prevent damaging the components when the cold plates are in contact (e.g., by damaging pins).

According to one embodiment, a liquid cooling module that includes: a chassis, a supply liquid manifold and a return liquid manifold, both manifolds arranged to fluidly couple to a coolant source, a piece of IT equipment that is mounted to the chassis and has an IT component, and a frame structure. The frame structure includes: a pair of primary beams that are coupled to the chassis, a pair of secondary beams, each secondary beam is coupled to both primary beams, and a cold plate that is coupled to the pair of secondary beams, the cold plate is arranged to come into direct contact with the IT component. The cold plate is fluidly coupled to the supply liquid manifold to receive liquid coolant from the coolant source, and is fluidly coupled to the return liquid manifold to return warmed liquid coolant to the coolant source that is produced by the cold plate when the cold plate is in direct contact with the IT component and heat generated by the IT component is transferred into the liquid coolant.

In another embodiment, each of the primary beams includes a channel extending upwardly from a bottom of the primary beam to a top of the primary beam and running along at least a portion of a length of the primary beam and, for each of the primary beams, the pair of secondary beams are slidably coupled to the primary beam along the channel via at least one fastener that passes through the channel.

In some embodiments, the pair of secondary beams include a first secondary beam and a second secondary beam, each of the secondary beams includes a channel extending upwardly from a bottom of the secondary beam to a top of the secondary beam and running along at least a portion of a length of the secondary beam, and the cold plate is slidably coupled to the first secondary beam via a first fastener that passes through the channel of the first secondary beam, and is slidably coupled to the second secondary beam via a second fastener that passes through the channel of the second secondary beam. In another embodiment, the cold plate includes a first hole through which the first fastener passes to couple the cold plate to the first secondary beam, and a second hole through which the second fastener passes to couple the cold plate to the second secondary beam.

In one embodiment, the liquid cooling module further includes a first pair of securing mechanisms and a second pair of securing mechanisms that are coupled to a bottom of the chassis and that each extend upwardly, wherein a first primary beam of the pair of primary beams is movably coupled to the first pair of securing mechanisms in a longitudinal direction along a length of the first pair, and a second primary beam of the pair of primary beams is movably coupled to the second pair of securing mechanisms in a longitudinal direction along a length of the second pair.

In some embodiments, each of the securing mechanisms includes an external screw thread, the frame structure further includes, for each of the external screw threads, an adjustable bracket having a threaded portion that is threadedly coupled to the external screw thread and a support portion that is coupled to a respective primary beam. In another embodiment, the support portion includes a curved channel extending upwardly from a bottom of the support portion to a top of the support portion and extends along a radial section of the support portion, and the respective primary beam is slidably coupled to the radial section of the support portion along the curved channel via a fastener that passes through the curved channel.

In one embodiment, the pair of secondary beams are moveably coupled to both primary beams, the pair of secondary beams is a first pair of secondary beams, the cold plate is a first cold plate, and the IT component is a first IT component, the frame structure further includes: a second pair of secondary beams that are each moveably coupled to both primary beams, a second cold plate that is coupled to the second pair of secondary beams, the second cold plate is arranged to come into direct contact with a second IT component, the first cold plate is fluidly coupled to the return liquid manifold via the second cold plate, and the second pair of secondary beams are arranged to move independently from the first pair of secondary beams.

In one embodiment, the IT component is a first IT component that is at least partially disposed above a top surface of the piece of IT equipment, wherein the piece of IT equipment also has a second IT component that is at least partially disposed below a bottom surface of the piece of IT equipment, the frame structure is a first frame structure and the cold plate is a first cold plate, the first frame structure is disposed above the piece of IT equipment and the first cold plate is arranged to come into direct contact with the first IT component, the liquid cooling module further includes a second frame structure that is disposed below the piece of IT equipment and includes a second cold plate that is arranged to come into direct contact with the second IT component.

In some embodiments, the liquid cooling module further includes, for each of the primary beams, a hinge that that couples the primary beam to the chassis, wherein the frame structure is arranged to pivot about the hinge.

According to another embodiment, a data center includes at least one data center IT room that includes one or more liquid cooling modules that are similar to the liquid cooling module previously described.

As described herein, to "couple" one component to another component may refer to fluidly coupling both components together thereby allowing a fluid, such as a cooling liquid (or liquid coolant) and/or a vapor, to flow between the two components. For example, to fluidly couple one line (or tube) to another refers to coupling (or connecting) the two lines such that fluid may flow from one line into the other line. In another embodiment, to "couple" one component to another component may refer to slidably coupling both components together, thereby allowing one component to slide (or move) in (at least) one direction with respect to the other component, while still being coupled together. For instance, to slidably coupling two beams together may refer to allowing one beam to slide in a longitudinal direction along a length of the other beam.

FIG. 1 shows a top-down view of a liquid cooling module for Information Technology (IT) equipment according to one embodiment. Specifically, this figure illustrates a liquid cooling module (or system) 10 (hereafter may be referred to as module) that is arranged to liquid cool IT components 10 that are mounted on at least one piece of IT equipment 9. As shown, the module includes a chassis 1, a frame structure 2, a supply liquid manifold 5, a return liquid manifold 6, and the piece of IT equipment 9. In one embodiment, the module may include more or less components. For example, the module may include one or more frame structures and/or pieces of IT equipment. As another example, the module may not include at least one of the manifolds. In another embodiment, both manifolds may be a part of a same liquid manifold.

In one embodiment, the (chassis 1 of the) module 10 may have similar dimensions in terms of height, depth, and/or width to that of an electronic server rack. As an example, the module 10 may have similar dimensions to a 42U rack, such as a height of approximately 80 inches, a depth of approximately 40 inches, and a width of approximately 19 or 21 inches. In another embodiment, the module may have different dimensions as described herein. In another embodiment, the (chassis 1 of the) module 10 illustrated herein may be a rectangular cuboid that is arranged to house one or more components described herein. In some embodiments, the module 10 may be any shape, such as cylindrically shaped. In some embodiments, the chassis 1 may be arranged to house (or contain) at least some of the components described herein. For instance, the chassis may house one or more pieces of IT equipment and/or one or more frame structures that are mounted therein.

As illustrated, the piece of IT equipment 9 includes eight IT components 10 arranged in a layout of four IT components in two columns. As described herein, the piece of IT equipment may be a server PCB on which one or more IT components are mounted. In one embodiment, the piece of IT equipment 9 is mounted inside the chassis 1 of the module 10. For instance, the chassis may include one or more brackets (not shown) on which the equipment is mounted (e.g., removably coupled). In one embodiment, the IT equipment may include more or less IT components arranged in any layout, such as by having twelve IT components in three columns of four. In one embodiment, the IT components may be any type of electronic component that is configured to perform data processing tasks, such as central processing units or CPUs, graphical processing units (GPUs), memory, and/or storage devices. Each IT component may perform data processing tasks, where the IT component may include software installed in a storage device, loaded into the memory, and executed by one or more processors to perform the data processing tasks. In one embodiment, the piece of IT equipment 9 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

The frame structure 2 includes a pair of primary beams 7a and 7b, a (first) pair of secondary beams 8a and 8b, another (second) pair of secondary beams 8c and 8d, eight cold plates 12a-12h, and several fasteners 13 (e.g., forty fasteners illustrated). As shown, the frame structure is disposed above the piece of IT equipment 9, such that each of the cold plates 12a-12h are arranged to come into (direct) contact with at least a portion of (a top surface of) a corresponding IT component. Thus, similar to the piece of IT equipment layout described herein, the components of the frame structure may be arranged such that the cold plates have a similar (or a same) layout as the IT components. For instance, coupled to the first pair of secondary beams are four cold plates 12a-12d, and coupled to the second pair of secondary beams are another four cold plates 12e-12h. The cold plates 12a-12h are arranged in a similar layout to the IT components 10, for example in two columns of four. In one embodiment, the cold plates 12a-12h may be arranged such that they are each aligned with a corresponding IT component. For instance, each cold plate may align with a center axis running perpendicular through a corresponding IT component. In one embodiment, at least some of the cold plates may have a (slightly) different alignment with respect to a corresponding IT component. For instance, the cold plates may be aligned up to a tolerance (e.g., 10%) with each corresponding IT component.

The frame structure 2 is arranged such that cold plates are coupled to (e.g., mounted below) secondary (or cross) beams, which are themselves coupled to (e.g., mounted on top of) primary (or main) beams. In particular, each end of the secondary beams is coupled to one of the primary beams (which both extend (substantially) in parallel with one another), via at least one fastener, such that the secondary beams extend (approximately) perpendicularly with respect to the primary beams. Similarly, each of the cold plates are coupled to one of the pairs of secondary beams (via two fasteners for each secondary beam) in a perpendicular fashion. In addition, the primary beams 7a and 7b are positioned at either side of the piece of IT equipment, as shown. In one embodiment, at least one of the primary beams is coupled to the chassis 1. In another embodiment, at least one of the primary beams may be adjusted (e.g., in a vertical direction with respect to the chassis). More about adjusting the primary beams is described herein. In one embodiment, the frame structure may be arranged differently (e.g., having only one primary beam and/or at least some cold plates only coupled to one (or more) secondary beams).

In one embodiment, the frame structure 2 may include more (or less) components. For instance, the structure may include more cold plates, based on the number of IT components 10. In one embodiment, the frame structure may have more (or less) cold plates than the number of IT components. In another embodiment, the frame structure is configurable (or adjustable) such that the layout of cold plates may be arranged (or re-arranged) based on the layout of the components of the piece of IT equipment. More about the configurability of the frame structure 2 is described herein.

Also illustrated, the components of the module 10 may couple to one another in order to create one or more heat exchanging loops associated with one or more of the cold plates 12a-12h. Specifically, the supply liquid manifold 5 and the return liquid manifold 6 are arranged to couple to one or more cold plates to create separate (and/or combine) heat exchanging loops within the module 10. For instance, the supply liquid manifold 5 is coupled to the supply line 18 to a coolant source (not shown), and the manifold is coupled to each of the cold plates 12a-12d, via a tube 14. The cold plates 12a-12d are coupled to cold plates 12e-12h. In particular, each of the cold plates 12a-12d are coupled to a corresponding one of the cold plates 12e-12h, via a tube 15. For example, cold plate 12a is coupled to cold plate 12e, via tube 15. Each of cold plates 12e-12h are coupled to the return liquid manifold 6, via a tube 16, and the manifold 6 is coupled to a return line 19 back to the coolant source. In one embodiment, the coolant source may be a single phase liquid-to-liquid heat exchanger. In another embodiment, the coolant source may be a data center cooling liquid system or an IT liquid cooling water system (not shown). In this case, the supply line 18 and the return line 19 may be a part of the system. In some embodiments, the coolant source may be any type of source configured to transfer heat away from warmed liquid coolant to produce cooled liquid coolant. In yet another embodiment, the supply line and/or return line may be coupled to another liquid cooling device, such as another module such that multiple modules are coupled in series.

As described herein, the module may have more or less cold plates that are in series (and/or) parallel with one another. As a result, the module may also not include other components associated with those cold plates. Specifically, when the module does not include cold plates 12e-12h, the module may not include the second pair of secondary beams and/or may not include tubes 15. For example, without cold plates 12e-12h, cold plates 12a-12d may couple (directly) to the return liquid manifold 6 via tubes 16.

In one embodiment, each of the four heat exchanging loops that includes two series coupled cold plates (e.g., cold plates 12a and 12e) may operate as follows. The supply liquid manifold 5 is arranged to receive liquid coolant from a coolant source via the supply line 18, and is arranged to supply (or distribute) the liquid coolant to each of the cold plates 12a-12d, via tubes 14. Each of the cold plates are arranged to thermally couple (by coming into direct contact with) a corresponding IT component 10. When the IT components are active, heat is generated which is transferred into liquid coolant that is flowing within the cold plates. The transferred heat warms the liquid coolant, thereby producing warmed liquid coolant. The cold plates are arranged to supply the warmed liquid coolant to cold plates 12e-12h, via tubes 15. Again, each of the cold plates 12e-12h transfer heat generated by corresponding IT components (with which the cold plates are thermally coupled) into the received warmed liquid coolant (e.g., to produce even warmer liquid coolant). The cold plates 12e-12h are arranged to supply the warmed liquid coolant to the return liquid manifold 6, via tubes 16. In one embodiment, the return liquid manifold is arranged to supply the warmed liquid coolant back to the coolant source in order for the liquid coolant to be recirculated. The heat exchanger is arranged to draw heat from warmed liquid coolant received from the return liquid manifold to produce cooled cooling liquid, which is then recirculated back into the module, via the supply line 18. Thus, as shown, the supply liquid manifold distributes (cool) liquid coolant through each of the four parallel heat exchanging loops, which then each dispel warmed liquid coolant into the return liquid manifold.

In one embodiment, the module 10 may include one or more pumps for circulating liquid coolant within the heat exchanging loop(s). For instance, the module may have a liquid pump coupled to the supply liquid manifold and configured to draw liquid coolant from the coolant source via the supply line 18 and push the drawn liquid coolant into one or more of the tubes 14. As another example, the module may have one or more liquid pumps coupled to the return liquid manifold 6 and configured to draw warmed liquid coolant from one or more cold plates (e.g., plates 12e-12h) and push the warmed liquid coolant back to the coolant source via the return line 19.

As illustrated, the supply liquid manifold 5 is coupled to the supply line 18 via an input supply port 3 and the return liquid manifold 6 is coupled to the return line 19 via an output return port 4. Each of the ports may include connectors such as dripless blind mating quick disconnects. For instance, each of the ports may be female dripless connectors. In this case, the end of the supply line 18 and the return line 19 that couples to a respective supply and return port may have male dripless connectors. Thus, as described herein, the module 10 may be added (or removed) from an external heat exchanging loop that includes a heat exchanger, such as the IT cooling water supply and return loop, as described herein.

In one embodiment, each of the components that are a part of the heat exchanging loops may be removably coupled to one another via similar connectors as described herein. For example, cold plate 12a may include a supply port (not shown) that is arranged to removably couple to tube 14 by being arranged such that the tube may be coupled to the port and uncoupled from the port. In addition, the plate may include a return port (not shown) that is arranged to removably couple to tube 15. As a result, each of the components within the loop may be removed (or added) into the loop. This may allow a technician to replace any faulty or inoperable components, and add additional cold plates based on the layout of the piece of IT equipment 9.

In one embodiment, the liquid coolant may be any type of thermally conductive dielectric liquid. In another embodiment, the liquid may be a non-toxic liquid. In some embodiments, the liquid may be designed and operated to have a high boiling point (e.g., above a threshold operating temperature for at least some major components, such as one or more of the IT components 10 that are mounted on the piece of IT equipment 9).

In one embodiment, the tubes 14-16 (and manifolds 5 and 6) may be composed of any material. For instance, the tubes may be composed of metal, such as copper, a polymer (e.g., an EPDM rubber), and/or plastic. In one embodiment, the tubes may be composed of a flexible material, such as rubber. In this example, all of the tubes may be flexible to allow cold plates to be (slightly) shifted based on the layout of the IT components. In another embodiment, some tubes may be different than other tubes. For instance, tubes 15 that couple cold plates 12a-12d to respective cold plates 12e-12h and/or tubes 16 that couple cold plates 12e-12h may each have a diameter that is larger than a diameter of each of the tubes 14 that couple cold plates 12a-12d to the liquid manifold 5.

As described thus far, the module 10 includes at least one single-phase heat exchanging loop in which liquid coolant is supplied to the cold plates 12a-12h, thereby producing warmed liquid coolant based on heat transferred from IT components 10 into the plates, and which the warmed liquid coolant is returned to a coolant source. In one embodiment, the module may include a two-phase heat exchanging loop. In this case, the return liquid manifold 6 may be a vapor manifold that is arranged to receive vapor produced by one or more cold plates that is produced when heat vaporizes at least some liquid coolant flowing through the cold plate. In another embodiment, the fluid circulating within a two-phase heat exchanging loop may circulate via phase change natural convection heat transfer. Specifically, heat generated by the IT components is transferred into the cold plates using natural convection (fluid or vapor is circulated using density difference and gravity) without the need of a mechanical (liquid and/or vapor) pump. As a result, vapor produced by the heat transfer may flow to the vapor manifold and out into the return line.

As described herein, the frame structure 2 may be rearranged to adjust the layout of the one or more cold plates. As illustrated, in one embodiment, each of the secondary beams 8a-8d are movably coupled to the primary beams 7a and 7b, via fasteners 13 that removably couple both beams together. Specifically, the secondary beams are movably (slidably) coupled to each of the primary beams such that they can move (or slide) longitudinally along the primary beams. For instance, the secondary beams may be placed (on top of and) along the primary beams at a desired location, and then coupled (e.g., in place) with one or more fasteners 13. As another example, the secondary beams may be placed along the primary beams, then fasteners may be used to couple the beams to the primary beams. The fasteners, however, may not be tightened, thereby allowing the secondary beams to slide along the primary beams. Once positioned at a desired location, the fasteners may be tightened to prevent future (undesired) movement or shifting. Similarly, the cold plates are movably coupled to the secondary beams, via fasteners 13 that removably couple both components together. More about adjusting the arrangement of the frame structure is described in FIGS. 3A and 3B.

In one embodiment, the module 10 may be composed of any material. Specifically, the chassis 1 and the components of the frame structure 2 may be composed of any material, such as a metal (e.g., steel, aluminum, etc.) or plastic. For instance, each of the primary beams and secondary beams may be composed of steel.

Figure 2:
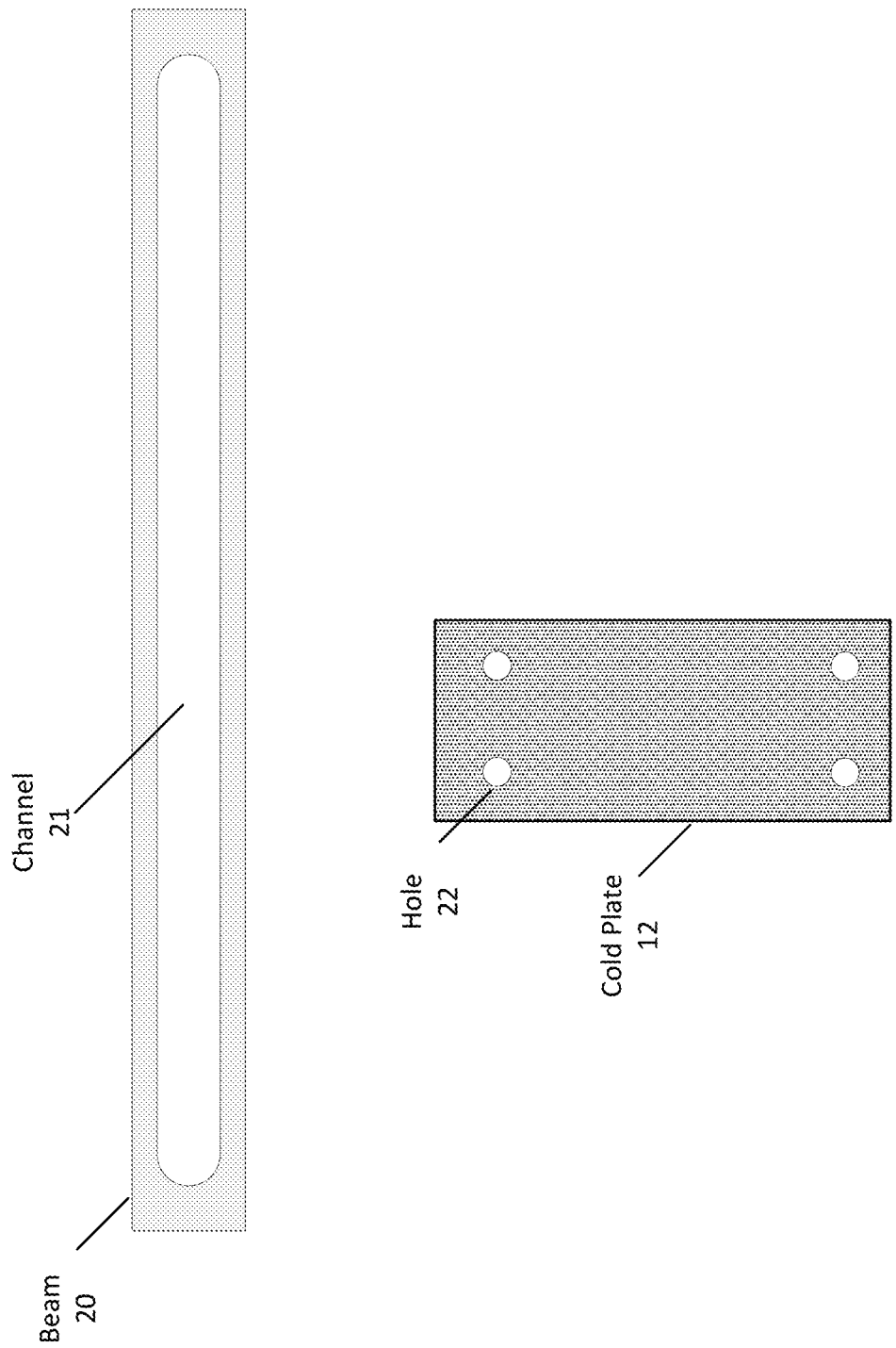
FIG. 2 shows a top-down view of a beam and a cold plate of the liquid cooling module according to one embodiment.

FIG. 2 shows a top-down view of a beam and a cold plate of the liquid cooling module according to one embodiment. Specifically, this figure illustrates a beam 20 and a cold plate 12, which may be components of the frame structure 2, which are dimensioned for rearranging a layout of cold plates, as described herein. As shown, beam 20 includes a (hollow) channel 21 that extends upwardly from a bottom of the beam to a top of the beam. In one embodiment, the channel runs along at least a portion of a length of the beam 20. In another embodiment, the beam 20 may include multiple separate channels. For instance, the beam may include two channels that both run along different portions of the length of the beam (e.g., which are separated by a portion of the beam). In another embodiment, the beam may include multiple channels that run concurrently along the length of the beam. In some embodiments, the beam may include at least one hole that extend through the beam.

The cold plate 12 includes four holes 22 that each extend upwardly from a bottom of the plate to a top of the plate. In particular, two of the holes are positioned at one end of the plate and the other two holes are positioned at another, opposite, end of the plate. In one embodiment, each of the holes may be located (near) each corner of the cold plate. In another embodiment, the plate may include more or less holes, which are located at different positions about the plate. In some embodiments, the cold plate may include at least one channel that runs at least a portion of a length of at least one side of the cold plate.

Figure 3A:
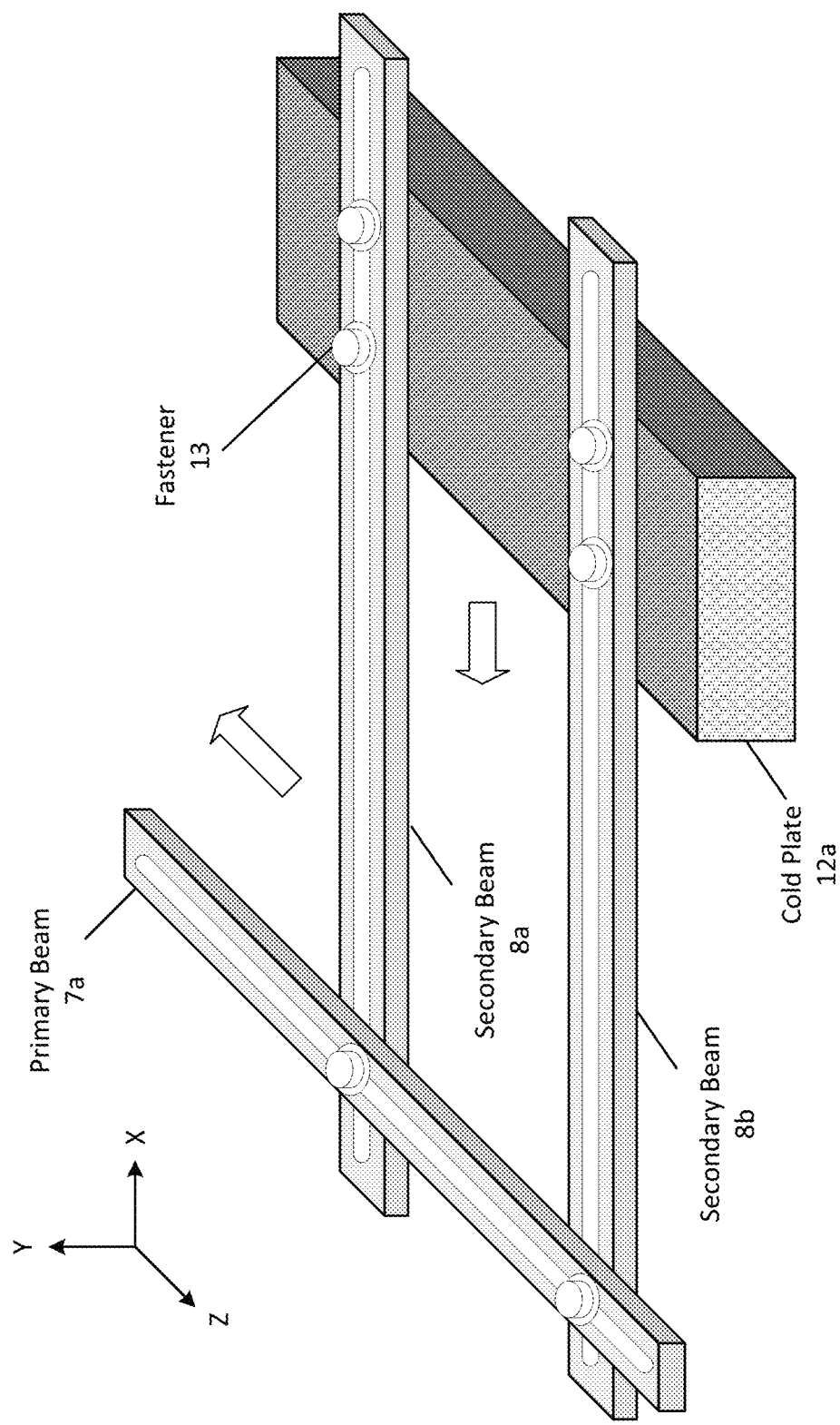
FIGS. 3A and 3B show a cold plate and several secondary beams of the liquid cooling module sliding to different positions according to one embodiment.
Figure 3B:
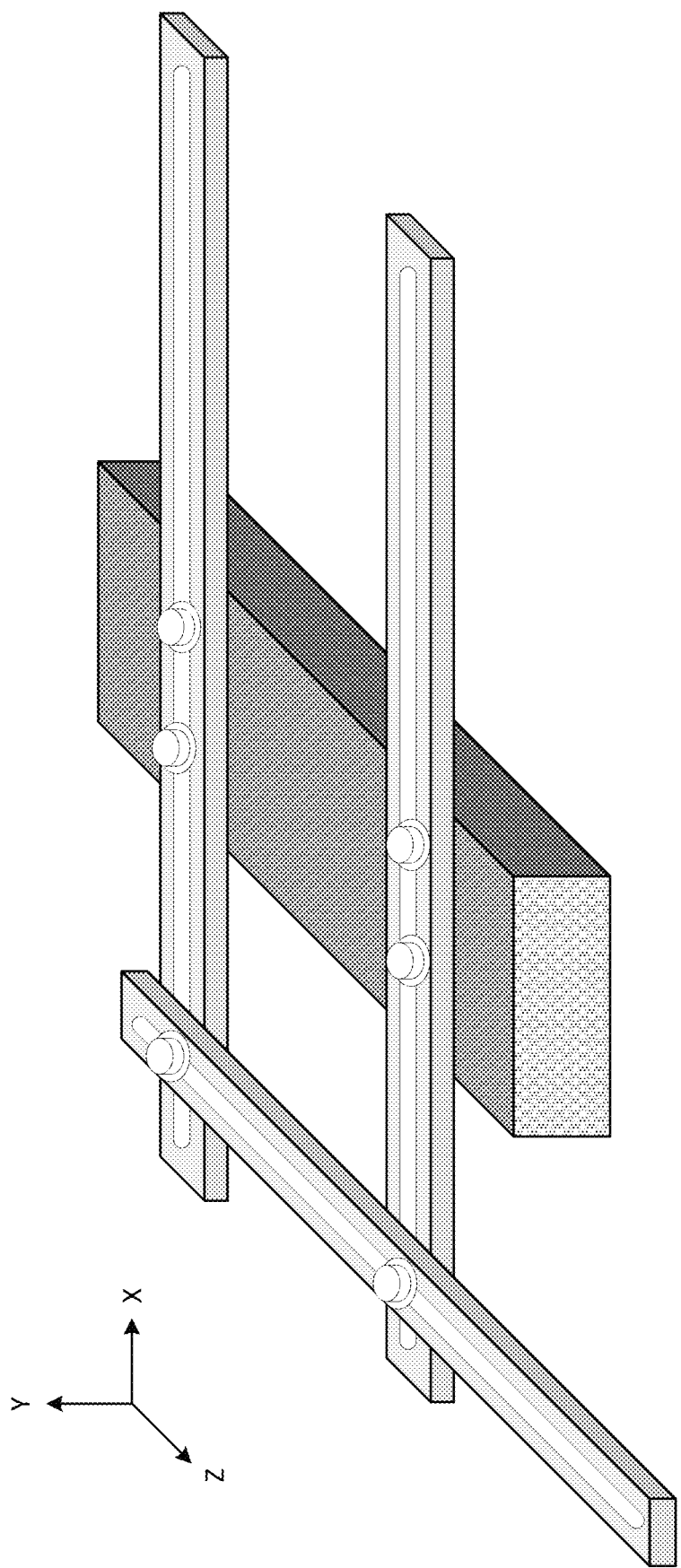

As described herein, the frame structure may be arranged (or rearranged) based on the layout of the piece of IT equipment. For instance, at least some of the primary beams 7a and 7b and the secondary beams 8a-8d may be dimensioned similarly to beam 20, such that the beams include at least one channel 21. In addition, at least some of the cold plates 12a-12h may be dimensioned similarly to cold plate 12, such that the plates include at least some holes. In one embodiment, the channel 21 and/or holes 22 may be dimensioned to receive a (portion of a) fastener (e.g., fastener 13) in order to couple two beams together and/or to couple a cold plate to a beam. In addition, the channel may be dimensioned such that a beam (e.g., secondary beam 8a) may be slidably coupled to another beam (e.g., primary beam 7a) along the channel using at least one fastener that passes through the channel. Thus, one beam may be able to slide along another beam to which it is coupled. FIGS. 3A and 3B illustrate such an example.

FIGS. 3A and 3B show a cold plate and several secondary beams of the liquid cooling module sliding to different positions according to one embodiment. In particular, these figures show a portion of the frame structure 2 that illustrates cold plate 12a slidably coupled to the first pair of secondary beams, 8a and 8b, which are themselves slidably coupled to primary beam 7a. Each of the beams in these figures include at least one channel that runs at least a portion of the length of the beams, similar to beam 20 of FIG. 2, and the cold plate 12a includes at least four holes, similar to cold plate 12 of FIG. 2.

The components are coupled to one another via fasteners 13. In one embodiment, the fastener includes at least one of a bolt, a nut, and a washer (for example, as illustrated in FIG. 6). As shown, to couple the cold plate 12a to the first pair of secondary beams, the four fasteners are passed through the channels of the secondary beams 8a and 8b (entering from the top), and then each of the fasteners are passed through a respective hole of the cold plate 12a. The fasteners are then fastened (e.g., tightened) to secure the cold plate onto each of the secondary beams. In one embodiment, at least one fastener is used to couple the cold plate to each secondary beam. For instance, the cold plate may include two holes, through which one (first) hole a first fastener passes to couple the cold plate to secondary beam 8a, and through which another (second) hole a second fastener passes to couple the cold plate to secondary beam 8b.

Similarly, the secondary beams 8a and 8b are coupled to the primary beam 7a via one fastener. In particular, for each secondary beam, a fastener is passed through channel of the primary beam 7a (entering from the top), and then passed through the channel of the secondary beam. Thus, the cold plate 12a is mounted below the secondary beams 8a and 8b, and the secondary beams are mounted below the primary beam 7a. In one embodiment, the beams and/or cold plate may be mounted differently. For example, the secondary beams may be mounted on top of the primary beam (e.g., having the fastener first enter the channel of the secondary beams.

In one embodiment, at least some of the beams may include a separate hole through which a fastener passes in order to couple the beams to another beam. For instance, as illustrated, to mount the secondary beam 8a to the primary beam 7a, the fastener passes through the channel of the secondary beam 8a. In one embodiment, the secondary beam may include a hole, which is separate from the channel, through which the fastener passes. In another embodiment, the beams may include such a hole at either end of the beams.

Returning to FIGS. 3A and 3B, FIG. 3A illustrates that the components are moving (sliding) in order to rearrange the layout. In particular, the cold plate 12a is sliding towards the primary beam (along the X-axis), and the secondary beams 8a and 8b are sliding along the channel of the primary beam 7a (along the Z-axis). In one embodiment, to slide the components the fasteners may be loosened but not entirely removed. In another embodiment, the fasteners may first be removed, and then the component may be positioned to an appropriate location, and then the fastener is then used to couple the component to its new location.

FIG. 3B illustrates after the components have moved. In one embodiment, once positioned, the fasteners may be fastened (e.g., a nut of the fastener may be tightened upon a bolt of the fastener) in order to prevent the components from inadvertently moving.

Figure 4A:
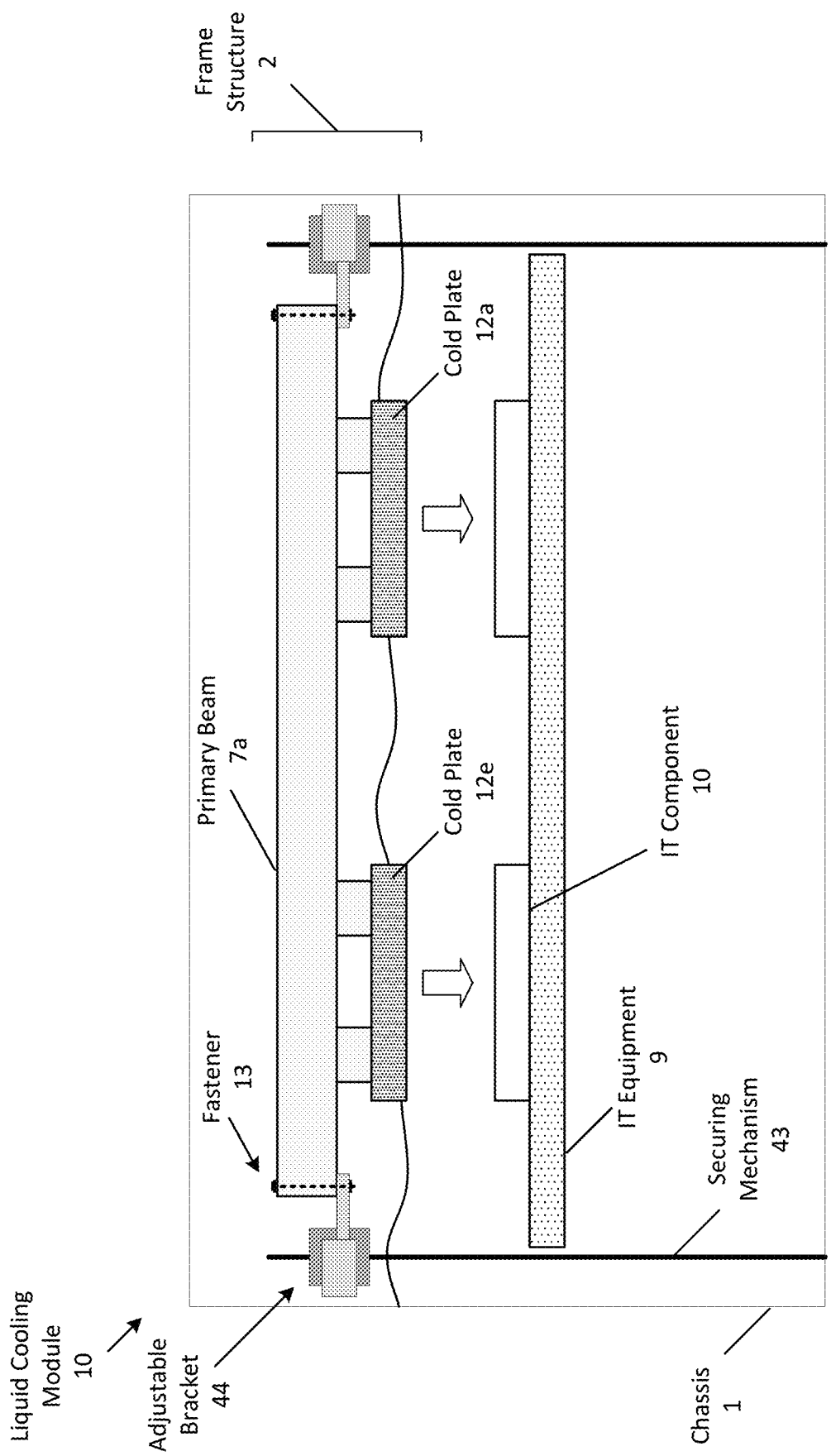
FIGS. 4A and 4B show a frame structure of the liquid cooling module coming into contact with IT components mounted on a piece of IT equipment according to one embodiment.
Figure 4B:
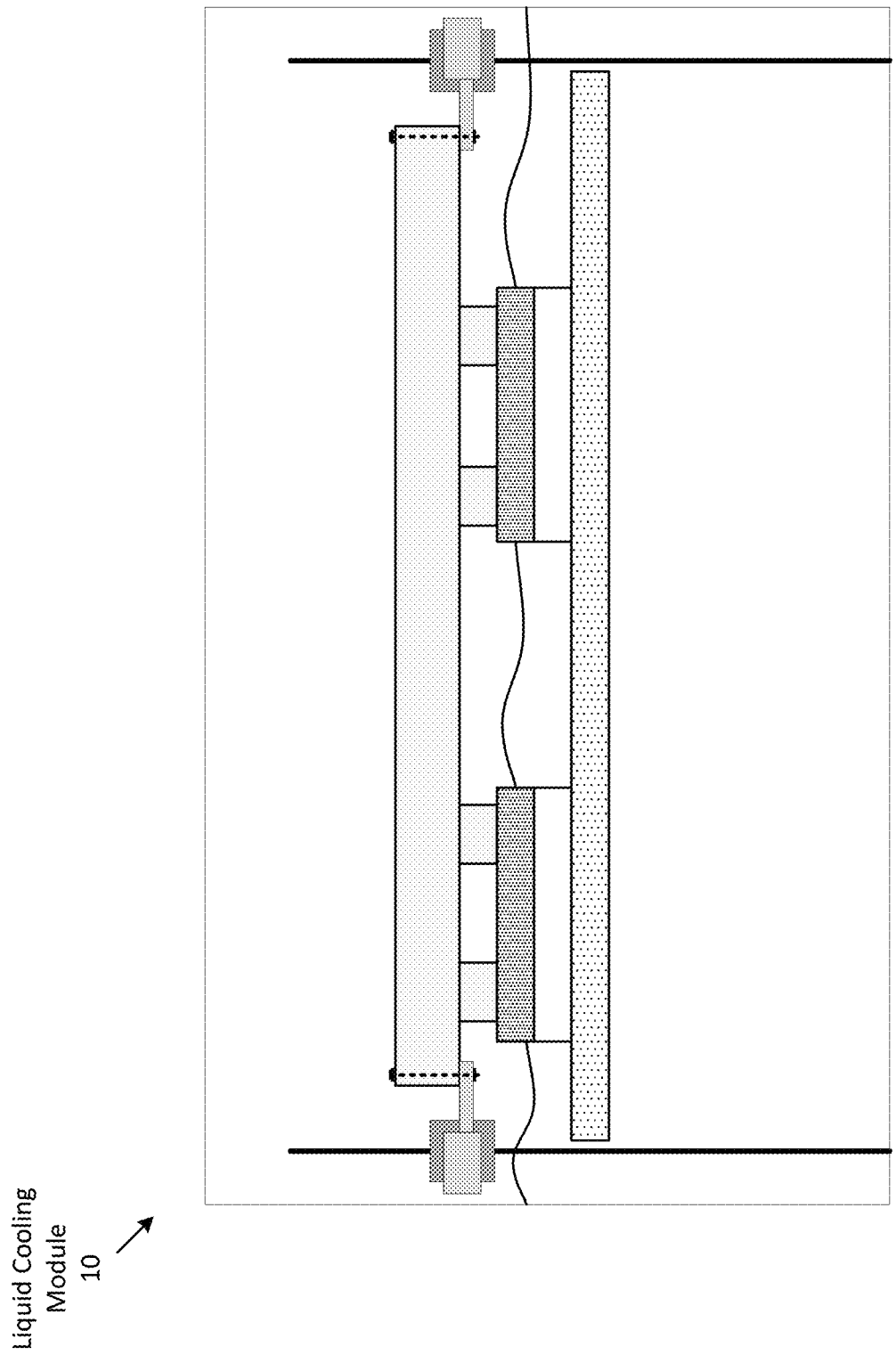

FIGS. 4A and 4B show a frame structure of the liquid cooling module coming into contact with IT components mounted on a piece of IT equipment according to one embodiment. Specifically, these figures illustrate a front-view of the liquid cooling module 10 in which the frame structure 2 is being lowered in order for the (bottom surface of the) cold plates (e.g., 12a-12h) to make contact with (the top surface of) IT components mounted on the piece of IT equipment 9.

In one embodiment, to adjust the (vertical) position of the frame structure 2, the structure includes adjustable brackets 44 that are movably coupled to securing mechanisms 43. As illustrated, the module 10 includes a (first) pair of securing mechanisms 43 that are each coupled to a different end of the primary beam 7a. In one embodiment, the module may include another (second) pair of securing mechanisms that are each coupled to a different end of the other primary beam 7b. In one embodiment, each of the securing mechanisms are coupled to a bottom of the chassis, next to (or proximate to) each corner of the chassis. Specifically, one side (a front side) may include two mechanisms towards either end of the side, and another, opposite, side (a back side) may include two other mechanisms towards either end of the other side. Each of the mechanisms may extend upwardly from the bottom of the chassis. For instance, the securing mechanisms may extend below the top of the chassis, or the mechanisms may extend all the way up to the top of the chassis in order to couple the mechanism to the top. In one embodiment, both primary beams are movably coupled to respective pairs of securing mechanisms in a longitudinal direction along a length of the securing mechanisms. In another embodiment each of the beams may independently move in the longitudinal direction.

In one embodiment, the securing mechanism includes an external screw thread that extends along at least a portion of a (longitudinal) length of the mechanism. For example, the securing mechanism may be a bolt that is screwed into the bottom of the chassis.

In one embodiment, adjustable brackets 44 are arranged to movably couple the primary beam 7a to at least one of the securing mechanisms 43. For instance, for each securing mechanism, the frame structure may include an adjustable bracket 44 that is threadedly coupled to the securing mechanism, and is (e.g., removably) coupled to an end of (at least one of) the primary beams, via a fastener 13, as illustrated in these figures. More about the adjustable brackets are described herein.

As shown in FIG. 4A, the frame structure 2 is being lowered towards the piece of IT equipment 9. In one embodiment, the frame structure may be lowed manually (e.g., by at least one technician). For instance, the technician may lower the structure by manipulating the adjustable bracket (e.g., with a tool or by hand). In one embodiment, each bracket may be independently adjusted to lower a corresponding side of the frame structure. More about manipulating the bracket 44 is described herein.

FIG. 4B shows the result of the frame structure 2 being lowered onto the piece of IT equipment. As shown, each of the cold plates is in direct contact with a corresponding IT component. In one embodiment, the adjustable brackets 44 are arranged to adjust an amount of contact pressure (or tightness) that is being applied onto the IT components by the cold plates. More about adjusting the contact tightness is described herein.

FIG. 5 shows a top-down view of an adjustable bracket of the liquid cooling module according to one embodiment. Specifically, this figure shows the adjustable bracket 44 that couples a primary beam to a securing mechanism. The adjustable bracket 44 includes a threaded portion 50 and a support portion 51. In one embodiment, the threaded portion is at least partially contained within the support portion, and is dimensioned to rotate independently from the support portion. For example, the bracket may include a bearing in which the threaded portion includes a shaft that rotates within a shaft of the support portion with little to no friction. In one embodiment, the threaded portion may include a flange at either end in order to keep the threaded portion contained within the support portion. The threaded portion 50 includes an internal screw thread and is arranged to threadedly couple to the external screw thread of the securing mechanism. Specifically, the thread portion threads over the securing mechanism.

The support portion 51 includes a curved channel 52 that extends upwardly from a bottom of the support portion to a top of the support portion and extends along a radial section 53 of the support portion. Specifically, the curved channel extends along approximately one-half the radial distance around which the support portion surrounds the threaded portion. As described herein, the curved channel is dimensioned to receive a fastener to mount a (primary) beam onto the adjustable bracket. Thus, the support portion is arranged to couple to a (respective) primary beam of the frame structure.

FIG. 6 shows another view of the adjustable bracket coupled to a primary beam of the liquid cooling module according to one embodiment. Specifically, this figure shows a side-view of the adjustable bracket 44 and a portion of the primary beam 7a to which it is coupled. As shown, the threaded portion 50 extends above (and below) at least a portion of the support portion 51. In one embodiment, the threaded portion 50 may extend either the top or bottom of the support portion 51. In one embodiment, the adjustable bracket is manipulated in order to raise or lower the bracket (along with the coupled primary beam) by manipulating the threaded portion 50. For instance, a technician may adjust the height of the adjustable bracket (with respect to the securing mechanism to which it is threadedly coupled) by coupling a tool to the threaded portion (or grasping the portion by hand), turning the threaded portion so as to thread the portion through the securing mechanism, thereby moving the adjustable bracket up or down. In one embodiment, the adjustable bracket may include an actuator or motor, which is arranged to mechanically thread the threaded portion, as described herein.

This figure also shows that the primary beam 7a is coupled to the support portion via fastener 13, which includes a bolt 60 and a nut 61. To couple the primary beam, the bolt 60 passes through the primary beam (e.g., a hole or a channel, such as channel 21 illustrated in FIG. 2) and passes through the curved channel 52. The bolt is then secured into place by threading the nut 61 onto a threaded portion of the bolt. In one embodiment, the primary beam is slidably coupled to the radial section 53 of the support portion 51 along the curved channel 52 via the fastener 13. This may allow the position of the frame structure 2 to be fine-tuned when lowering the structure onto the IT components. For example, the primary beam may slide along the curved channel while the fastener is loose, and when positioned at a desired location (e.g., when the cold plates of the structure are aligned with the IT components), the bolt may be tightened.

Figure 7:
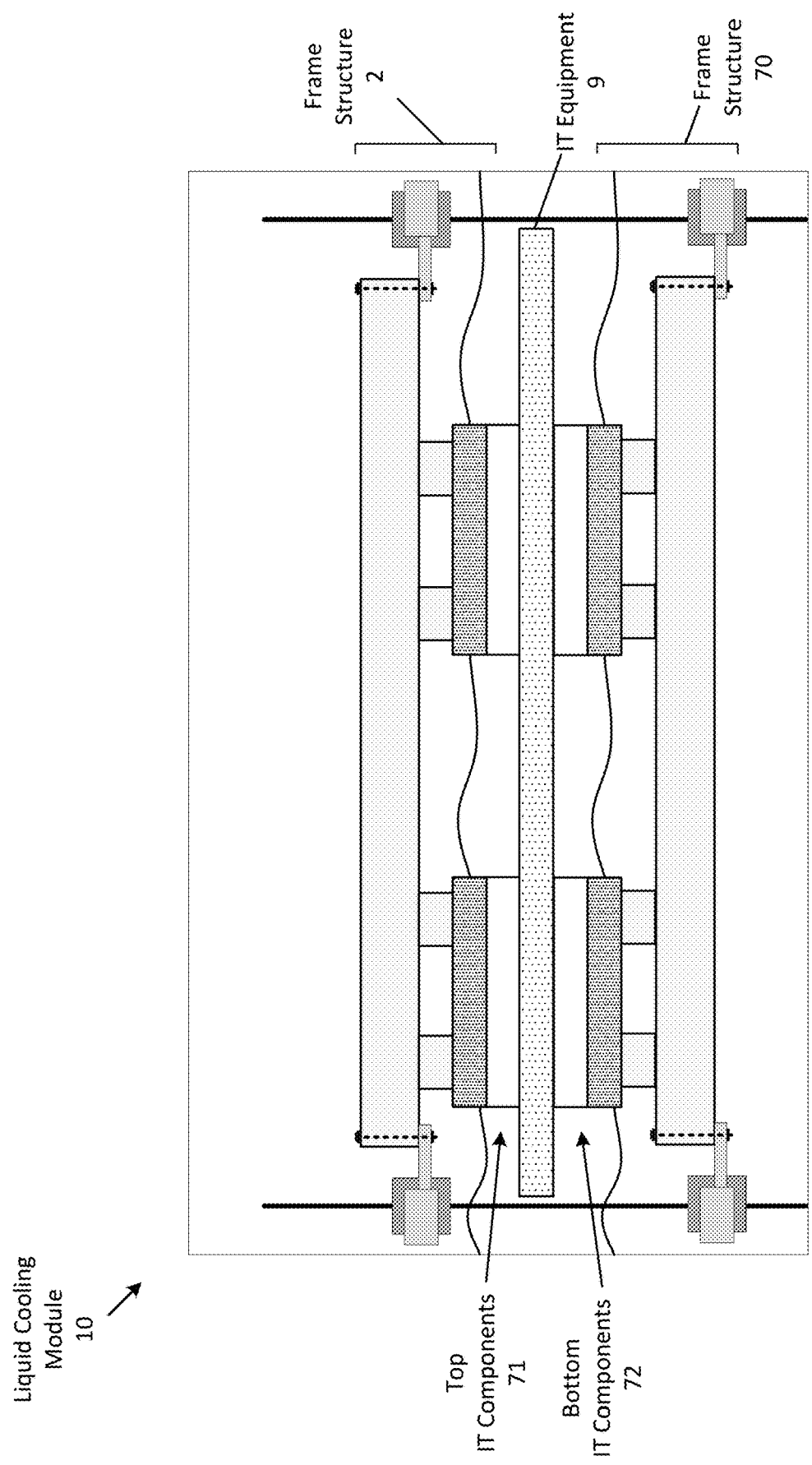
FIG. 7 is another example of a liquid cooling module that includes several frame structures according to one embodiment.

FIG. 7 is another example of a liquid cooling module that includes several frame structures according to one embodiment. Specifically, this figure illustrates two frame structures, where (a first) frame structure 2 that is at least partially disposed above a top surface of the piece of IT equipment. In addition, the module includes (a second) frame structure 70 that is at least partially disposed below a bottom surface of the piece of IT equipment. In this figure, the piece of IT equipment has two sets of IT components mounted on opposite sides of (e.g., a substrate of) the IT equipment. In particular, the piece of IT equipment has top IT components 71 that are mounted on top of the piece of IT equipment, and has bottom IT components 72 that are mounted on the bottom of the piece of IT equipment. As described herein, the frame structure 2 is arranged to be lowered (e.g., by manipulating at least one of the adjustable brackets) onto the IT equipment such that at least some of the cold plates of the frame structure come into direct contact with the top IT components. The frame structure 70, on the other hand is arranged such that cold plates of the structure are raised upward from below the piece of IT equipment to come into direct contact with the bottom IT components 72. In one embodiment, at least some of the components of the frame structure 70 is arranged in an opposite fashion to the frame structure 2. For example, the cold plates are mounted on top of the secondary beams and the secondary beams are mounted on top of the primary beams. In another embodiment, however, either of the frame structures may have any different type of configuration of components.

In one embodiment, any of the adjustable brackets may be manipulated to adjust an amount of contact pressure (or tightness) that is being applied the IT components by the cold plates. For example, to adjust the contact pressure, a technician may thread the threaded portion 50 of an adjustable bracket (e.g., by turning the portion clockwise), until reaching a desired tightness. For example, to turn the threaded portion, a technician may use a torque measuring tool to determine how tightness of the threaded portion, which may be related to the tightness between the cold plates and a corresponding IT component.

Figure 8A:
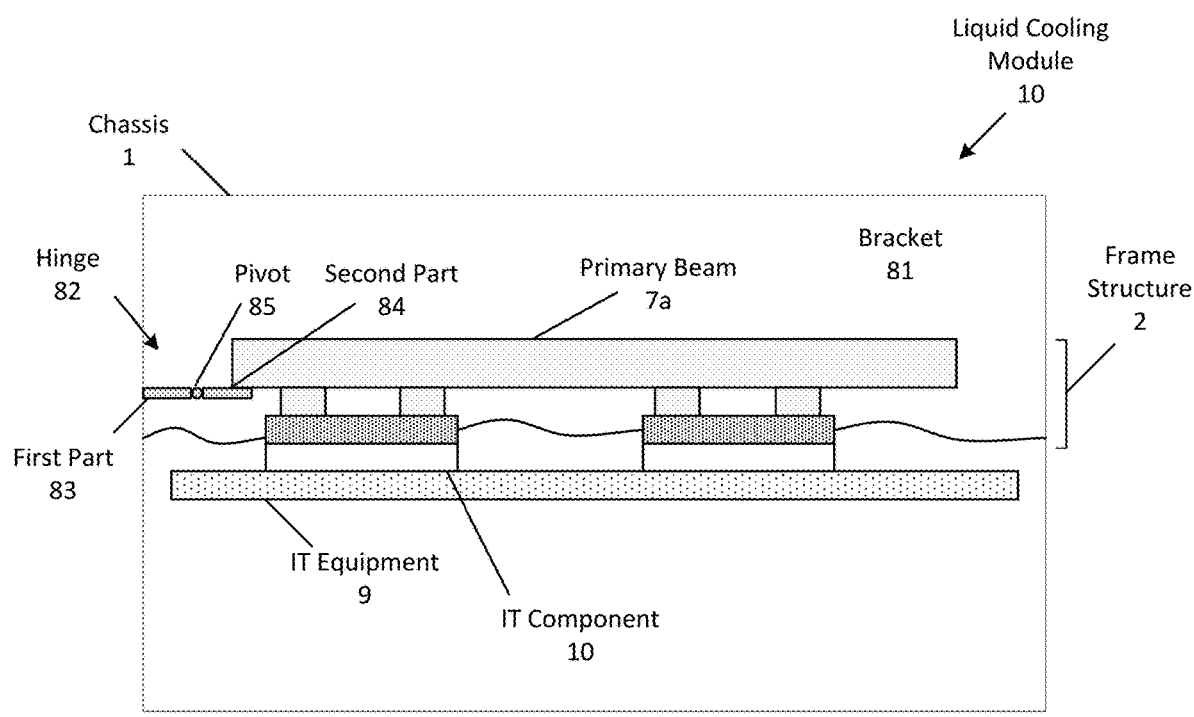
FIGS. 8A and 8B show an example of a pivotable frame structure of another liquid cooling module according to one embodiment.
Figure 8B:
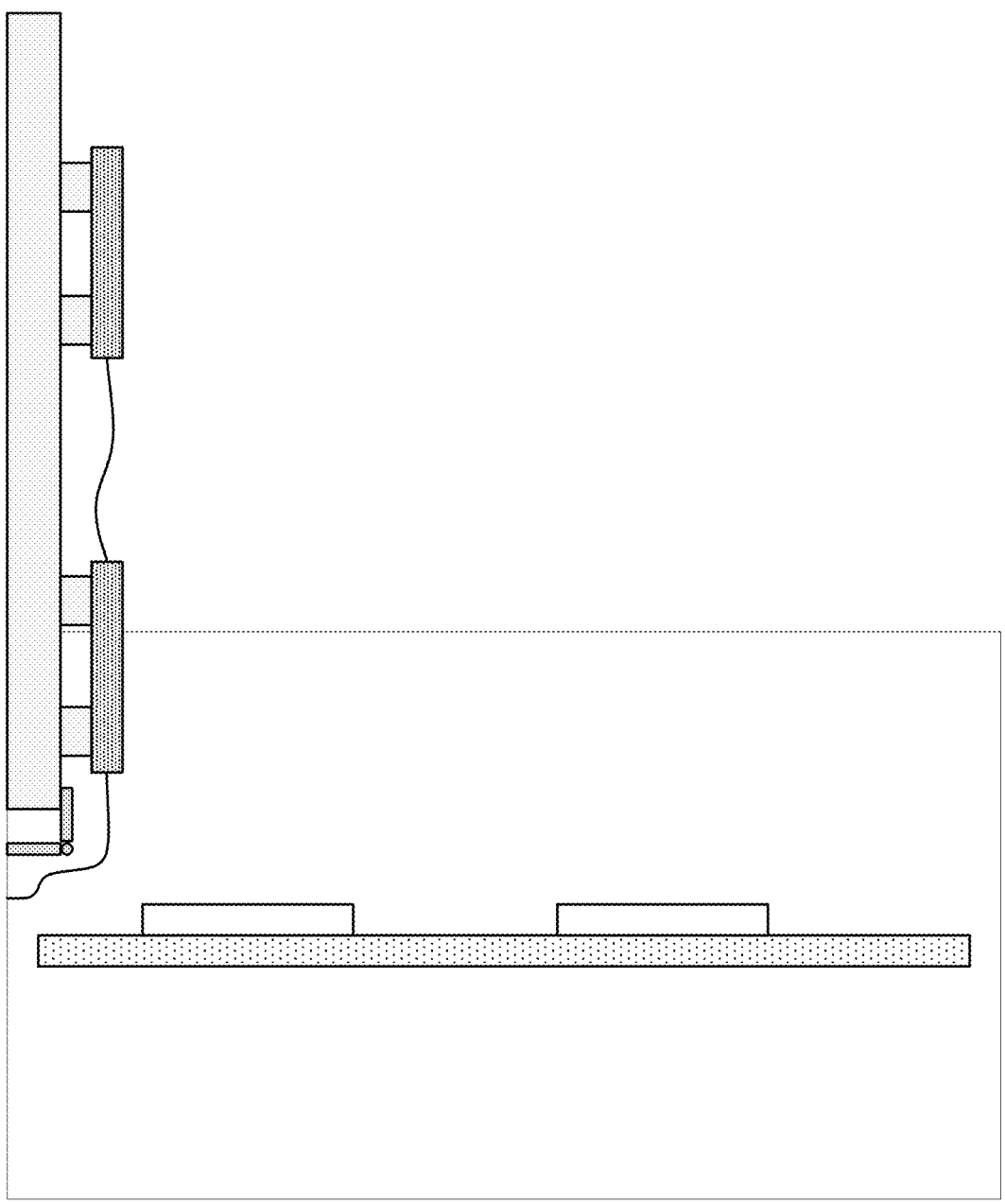

FIGS. 8A and 8B show an example of a pivotable frame structure of another liquid cooling module according to one embodiment. Specifically, these figures show the liquid cooling module 10 in which the frame structure 2 is pivotably coupled (mounted) to the chassis 1 of the module via a hinge 82. As shown, the module includes a hinge 82 that includes a first part 83, a second part 84, and a pivot 85. In one embodiment, the first part 83 is a structure that is coupled to the chassis 1 and extends inward from the side of the chassis on which the first part is coupled. The second part 84 is a structure that is (removably) coupled to the primary beam 7a. In one embodiment, the second part may be coupled via a fastener, such as fastener 13. The pivot 85 includes a pivoting axis that extends along the depth of the module (e.g., along the Z-axis, as shown in FIG. 3A). In one embodiment, the each of the primary beams (e.g., both 7a and 7b) may be coupled to a (separate) hinge, such that the frame structure may be pivotably coupled to the chassis 1 as illustrated in these figures.

FIG. 8A shows the liquid cooling module 10, while the frame structure is in a closed position in which the cold plates of the frame structure 2 are in direct contact with the IT components 10 of the piece of IT equipment 9. While in this position, both primary beams 7a and 7b are in a substantially horizontal position. FIG. 8B shows the liquid cooling module, while the frame structure is in an open position in which the frame structure has pivoted about (the pivot axis of) the pivot 85 by approximately 90°. As a result, when the frame structure is in the open position, a technician may perform maintenance or service upon the module, without disturbing the piece of IT equipment. Once component, the frame structure may be lowered back on top of the IT equipment. In one embodiment, this arrangement allows the frame structure to be mounted (or placed) on top of the IT components without the need for an adjustable bracket.

Figure 9:
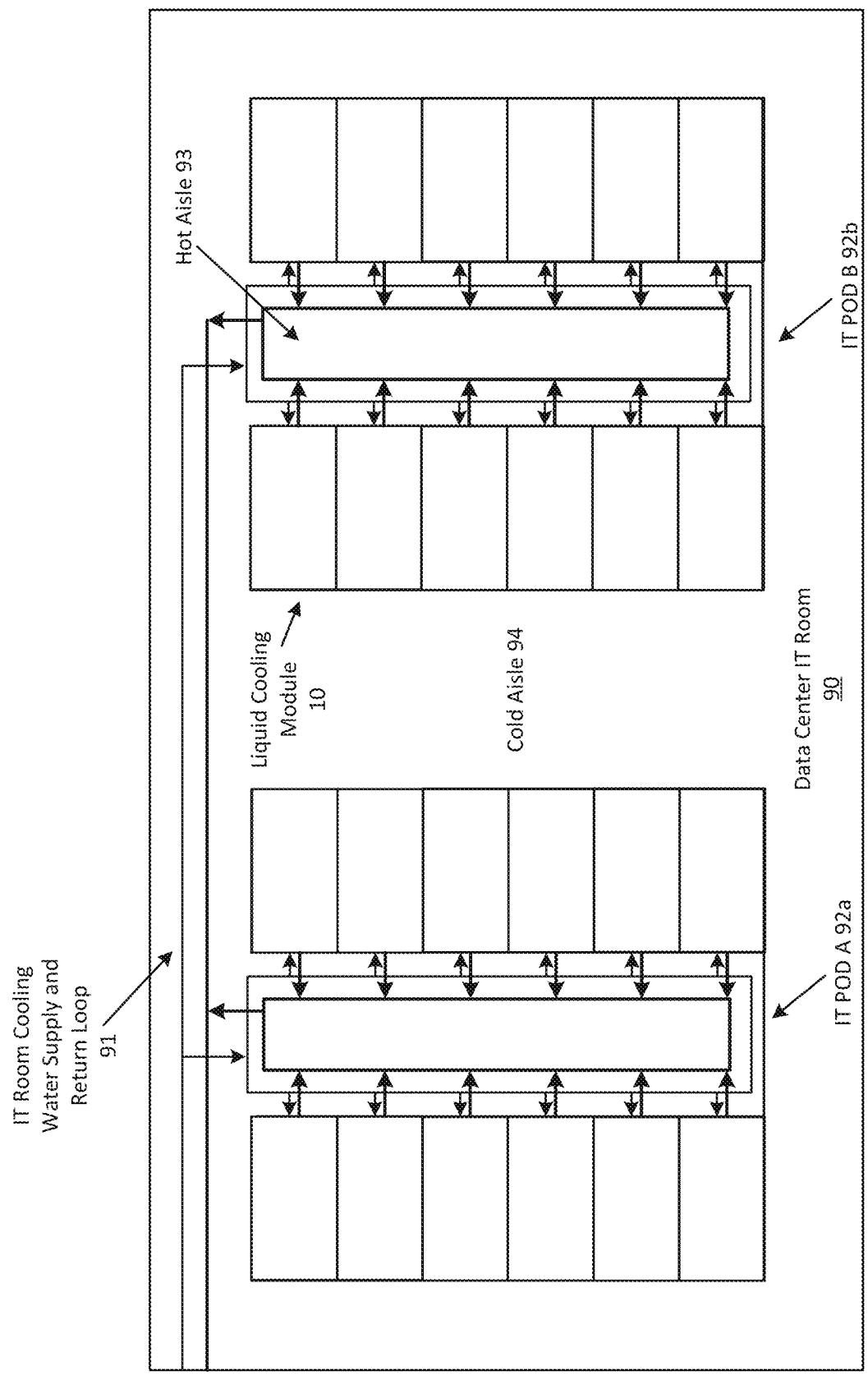
FIG. 9 shows an example of an IT room in a data structure with installed liquid cooling modules according to one embodiment.

FIG. 9 shows an example of an IT room in a data structure with installed liquid cooling modules according to one embodiment. Specifically, this figure illustrates a data center IT room 90 (of a data center) with two IT PODs, POD A 92a and POD B 92b, and an IT room cooling water and return loop 91. Each POD is surrounded by a cold aisle 94, and has a hot aisle 93 in the middle of the POD. Both IT PODs are populated with twelve liquid cooling modules 10 on each side of the hot aisle. In one embodiment, either pod may include one or more other server racks, along with (or in lieu of) the liquid cooling modules 10. Each of the modules is coupled to the IT room cooling water supply and return loop 91. In one embodiment, the supply line 18 and the return line 19 may be a part of the return loop 91.

In one embodiment, the liquid cooling module may also have one or more openings (e.g., on the chassis 1) in order to air cool at least some of the pieces of IT equipment contained therein. Thus, modules that may also be air cooled may draw (e.g., using one or more fans) cool air from the cold aisle 94 in order transfer heat contained from one or more pieces of IT equipment (or IT components), thereby producing hot exhaust air that is pushed into the hot aisle 93. Warmed air in the hot aisle 93 may be air conditioned using any type of data center air condition unit and may be circulated back into the cold aisle 94. This design enables for air cooled components within the module to be cooled in addition to liquid cooled components that are coupled to cold plates as described herein.

As previously explained, an embodiment of the disclosure may be (or include) a non-transitory machine-readable medium (such as microelectronic memory) having stored thereon instructions, which program one or more data processing components (generically referred to here as a "processor") to perform cooling operations, such the flow rate of one or more liquid pumps and/or one or more vapor pumps, as described herein. In other embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A liquid cooling module comprising:
    a chassis;
    a piece of information technology (IT) equipment that is mounted to the chassis and has an IT component;
    a heat exchanging liquid circuit that includes:
        a supply liquid manifold and a return liquid manifold, both of the liquid manifolds arranged to fluidly couple to a coolant source,
        a first tube coupled to receive liquid coolant from the supply liquid manifold,
        a second tube coupled to return the liquid coolant to the return liquid manifold,
        a cold plate that is fluidly and removably coupled to the first tube to receive the liquid coolant, and is fluidly and removably coupled to the second tube to return warmed liquid coolant to the return liquid manifold that is produced by the cold plate when the cold plate is in contact with the IT component and heat generated by the IT component is transferred into the liquid coolant; and
    a frame structure that includes:
        a pair of primary beams that are coupled to the chassis, and
        a pair of secondary beams, each of the secondary beams is movably coupled to both of the primary beams,
    wherein the cold plate is movably coupled to the pair of secondary beams.

2. The liquid cooling module of claim 1,
    wherein each of the primary beams includes a channel extending upwardly from a bottom of each of the primary beams to a top of each of the primary beams and running along at least a portion of a length of each of the primary beams, and
    wherein, for each of the primary beams, the pair of secondary beams are movably coupled to the primary beams along the channel via at least one fastener that passes through the channel.

3. The liquid cooling module of claim 1,
    wherein the pair of secondary beams include a first secondary beam and a second secondary beam, wherein each of the secondary beams includes a channel extending upwardly from a bottom of each of the secondary beams to a top of each of the secondary beams and running along at least a portion of a length of each of the secondary beams, and
    wherein the cold plate is movably coupled to the first secondary beam via a first fastener that passes through the channel of the first secondary beam, and is movably coupled to the second secondary beam via a second fastener that passes through the channel of the second secondary beam.

4. The liquid cooling module of claim 3, wherein the cold plate comprises a first hole through which the first fastener passes to couple the cold plate to the first secondary beam, and a second hole through which the second fastener passes to couple the cold plate to the second secondary beam.

5. The liquid cooling module of claim 1 further comprising a first pair of securing mechanisms and a second pair of securing mechanisms that are coupled to a bottom of the chassis and that each extend upwardly, wherein a first primary beam of the pair of primary beams is movably coupled to the first pair of securing mechanisms in a longitudinal direction along a length of the first pair of securing mechanisms, and a second primary beam of the pair of primary beams is movably coupled to the second pair of securing mechanisms in a longitudinal direction along a length of the second pair of securing mechanisms.

6. The liquid cooling module of claim 5,
    wherein each of the securing mechanisms comprises an external screw thread, and
    wherein the frame structure further comprises, for each of the external screw threads, an adjustable bracket having a threaded portion that is threadedly coupled to the external screw thread and a support portion that is coupled to a respective one of primary beams.

7. The liquid cooling module of claim 6,
    wherein the support portion comprises a curved channel extending upwardly from a bottom of the support portion to a top of the support portion and extends along a radial section of the support portion, and
    wherein the respective primary beam is movably coupled to the radial section of the support portion along the curved channel via a fastener that passes through the curved channel.

8. The liquid cooling module of claim 1, wherein the pair of secondary beams are moveably coupled to both of the primary beams, wherein the pair of secondary beams is a first pair of secondary beams, the cold plate is a first cold plate, and the IT component is a first IT component, wherein the frame structure further includes:
    a second pair of secondary beams that are each moveably coupled to both of the primary beams; and
    a second cold plate that is coupled to the second pair of secondary beams, the second cold plate is arranged to come into contact with a second IT component, wherein the first cold plate is fluidly coupled to the return liquid manifold via the second cold plate,
    wherein the second pair of secondary beams are arranged to move independently from the first pair of secondary beams.

9. The liquid cooling module of claim 1, wherein the IT component is a first IT component that is at least partially disposed above a top surface of the piece of IT equipment, wherein the piece of IT equipment also has a second IT component that is at least partially disposed below a bottom surface of the piece of IT equipment,
    wherein the frame structure is a first frame structure and the cold plate is a first cold plate,
    wherein the first frame structure is disposed above the piece of IT equipment and the first cold plate is arranged to come into contact with the first IT component, and
    wherein the liquid cooling module further comprises a second frame structure that is disposed below the piece of IT equipment and includes a second cold plate that is arranged to come into contact with the second IT component.

10. The liquid cooling module of claim 1 further comprises two hinges, each of the two hinges couples one of the primary beams to the chassis, wherein the frame structure is arranged to pivot about the two hinges.

11. A data center comprising:
   a data center information technology (IT) room; and
   one or more liquid cooling modules within the IT room, each of the one or more liquid cooling modules includes:
      a chassis;
      a piece of information technology (IT) equipment that is mounted to the chassis and has an IT component;
      a heat exchanging liquid circuit that includes:
         a supply liquid manifold and a return liquid manifold, both of the liquid manifolds arranged to fluidly couple to a coolant source,
         a first tube coupled to receive liquid coolant from the supply liquid manifold,
         a second tube coupled to return the liquid coolant to the return liquid manifold,
         a cold plate that is fluidly and removably coupled to the first tube to receive the liquid coolant, and is fluidly and removably coupled to the second tube to return warmed liquid coolant to the return liquid manifold that is produced by the cold plate when the cold plate is in contact with the IT component and heat generated by the IT component is transferred into the liquid coolant; and
      a frame structure that includes:
         a pair of primary beams that are coupled to the chassis, and
         a pair of secondary beams, each of the secondary beams is movably coupled to both of the primary beams,
      wherein the cold plate is movably coupled to the pair of secondary beams.

12. The data center of claim 11,
   wherein each of the primary beams includes a channel extending upwardly from a bottom of each of the primary beams to a top of each of the primary beams and running along at least a portion of a length of each of the primary beams, and
   wherein, for each of the primary beams, the pair of secondary beams are movably coupled to the primary beams along the channel via at least one fastener that passes through the channel.

13. The data center of claim 11,
   wherein the pair of secondary beams include a first secondary beam and a second secondary beam, wherein each of the secondary beams includes a channel extending upwardly from a bottom of each of the secondary beams to a top of each of the secondary beams and running along at least a portion of a length of each of the secondary beams, and
   wherein the cold plate is movably coupled to the first secondary beam via a first fastener that passes through the channel of the first secondary beam, and is movably coupled to the second secondary beam via a second fastener that passes through the channel of the second secondary beam.

14. The data center of claim 13, wherein the cold plate comprises a first hole through which the first fastener passes to couple the cold plate to the first secondary beam, and a second hole through which the second fastener passes to couple the cold plate to the second secondary beam.

15. The data center of claim 11 further comprising a first pair of securing mechanisms and a second pair of securing mechanisms that are coupled to a bottom of the chassis and that each extend upwardly, wherein a first primary beam of the pair of primary beams is movably coupled to the first pair of securing mechanisms in a longitudinal direction along a length of the first pair of securing mechanisms, and a second primary beam of the pair of primary beams is movably coupled to the second pair of securing mechanisms in a longitudinal direction along a length of the second pair of securing mechanisms.

16. The data center of claim 15,
   wherein each of the securing mechanisms comprises an external screw thread, and
   wherein the frame structure further comprises, for each of the external screw threads, an adjustable bracket having a threaded portion that is threadedly coupled to the external screw thread and a support portion that is coupled to a respective one of primary beams.

17. The data center of claim 16,
   wherein the support portion comprises a curved channel extending upwardly from a bottom of the support portion to a top of the support portion and extends along a radial section of the support portion, and
   wherein the respective primary beam is movably coupled to the radial section of the support portion along the curved channel via a fastener that passes through the curved channel.

18. The data center of claim 11, wherein the pair of secondary beams are moveably coupled to both of the primary beams, wherein the pair of secondary beams is a first pair of secondary beams, the cold plate is a first cold plate, and the IT component is a first IT component, wherein the frame structure further includes:
   a second pair of secondary beams that are each moveably coupled to both of the primary beams; and
   a second cold plate that is coupled to the second pair of secondary beams, the second cold plate is arranged to come into contact with a second IT component, wherein the first cold plate is fluidly coupled to the return liquid manifold via the second cold plate,
   wherein the second pair of secondary beams are arranged to move independently from the first pair of secondary beams.

19. The data center of claim 11, wherein the IT component is a first IT component that is at least partially disposed above a top surface of the piece of IT equipment, wherein the piece of IT equipment also has a second IT component that is at least partially disposed below a bottom surface of the piece of IT equipment,
   wherein the frame structure is a first frame structure and the cold plate is a first cold plate,
   wherein the first frame structure is disposed above the piece of IT equipment and the first cold plate is arranged to come into contact with the first IT component, and
   wherein the liquid cooling module further comprises a second frame structure that is disposed below the piece of IT equipment and includes a second cold plate that is arranged to come into contact with the second IT component.

20. The data center of claim 11, further comprises two hinges, each of the two hinges couples one of the primary beams to the chassis, wherein the frame structure is arranged to pivot about the two hinges.

* * * * *